(12) United States Patent
Strzalkowski

(10) Patent No.: US 6,670,827 B2
(45) Date of Patent: Dec. 30, 2003

(54) TRI-STATE DRIVER ARRANGEMENT

(75) Inventor: Bernhard Strzalkowski, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/957,632

(22) Filed: Sep. 20, 2001

(65) Prior Publication Data

US 2003/0025525 A1 Feb. 6, 2003

(30) Foreign Application Priority Data

Sep. 21, 2000 (DE) ......................... 100 46 806

(51) Int. Cl.[7] ........................................ H03K 19/0175
(52) U.S. Cl. ..................... 326/56; 326/82; 326/57
(58) Field of Search ................. 326/56–58, 82, 326/86, 90; 375/219, 220, 257, 258

(56) References Cited

U.S. PATENT DOCUMENTS 5,815,528 A * 9/1998 Koga et al. ................. 375/220
6,054,780 A    4/2000 Haigh et al. ................. 307/91
6,262,600 B1 * 7/2001 Haigh et al. ................. 326/82

FOREIGN PATENT DOCUMENTS

DE        197 18 420 A1    11/1998

* cited by examiner

*Primary Examiner*—Anh Tran
(74) *Attorney, Agent, or Firm*—Peter F. Corless; David J. Silvia; Edwards & Angell, LLP

(57) ABSTRACT

A tri-state driver arrangement has a coupler (2) for the potential-free transmission of signals between an input and an output of the tri-state driver arrangement (1) and an output driver (8) with tri-state characteristics connected to the output. In order to reduce the outlay on the circuit and the power of the driver, in a first embodiment the coupler (2) is arranged as a magnetic coupler. In a second embodiment, it is proposed that the output voltage ($U_{OUT}$) of the coupler (2) is to be monitored with respect to certain threshold values ($-U_{TH}$, $+U_{TH}$) in order to switch the output driver (8) into the tri-state condition depending upon this output voltage.

12 Claims, 3 Drawing Sheets

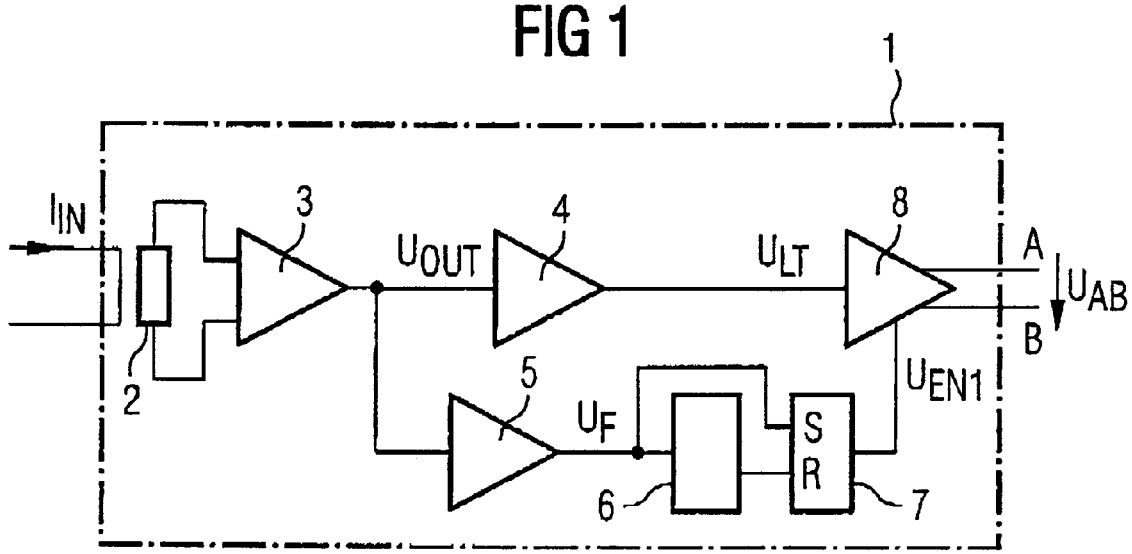
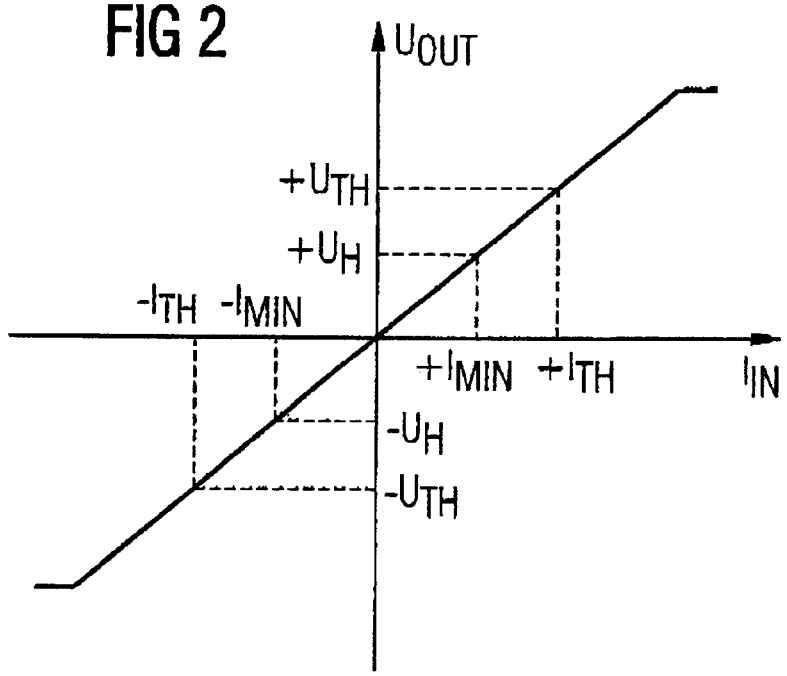

TRI-STATE DRIVER ARRANGEMENT

This invention relates to a tri-state driver arrangement in accordance with the pre-characterising portion of claim 1, and in particular a tri-state driver arrangement, which can be used to send data from a subscriber via a communications bus to a further subscriber using an interface, for example in accordance with the RS-485 standard.

The RS-485 standard is used to define the transmission of information across different communications busses. Here, the communications bus consists of a two-wire cable to which the individual bus subscribers are connected in parallel and where several bus subscribers are able to receive data sent from another bus subscriber at the same time (so-called "multi-drop" configuration). On account of the high number of node points and the need for a reliable transmission of data or signals, all bus subscribers are potentially isolated from the communications bus. Furthermore, the line drivers or output drivers associated with the individual bus subscribers must have tri-state characteristics, i.e. along with the states "L" and "H", they can take a third, high-impedance state. If a bus subscriber is active, i.e. if the output driver associated with this bus subscriber is sending data, all the other bus subscribers must be in the receive mode and disconnect their output drivers from the communications bus, i.e. switch to the above-mentioned tri-state condition.

FIG. 5 shows an example of a potentially isolated RS-485 interface according to the state of the art. The RS-485 interface incorporates a tri-state driver 12 acting as a transmitter with an output driver 16, which is connected to a two-wire bus-cable A, B. Transmitted data TxD are fed to the tri-state driver 12 and amplified by means of an amplifier 14. A fast optocoupler 15 transfers the transmitted data with potential isolation to the output driver 16. Furthermore, an activation or enable signal is fed to the tri-state driver 12 and amplified by means of an amplifier 17. A slow-acting optocoupler transfers the enable signal to the output driver 16 in the form of an appropriate voltage $U_{EN1}$ via a further amplifier 19 with potential isolation, whereby the output driver 16 is activated or deactivated depending upon the value of the voltage $U_{EN1}$, i.e. switched to the tri-state condition. Furthermore, the RS-485 interface incorporates a receiver 13, which is also connected to the two-wire bus-cable A, B, whereby an amplifier 20 receives and amplifies data transmitted from another subscriber, which are output as received data RxD via a further fast optocoupler 21 and a driver 22.

As can be seen from FIG. 5, the RS-485 interface or the appropriate tri-state driver 12 needs two channels, each with an optocoupler, for sending the transmitted data TxD and for activating/deactivating the output driver 16, i.e. the number of components required and the driver power are relatively high.

This invention is therefore based on producing a tri-state driver arrangement, which enables the potentially isolated transmission of signals with minimum driver outlay.

This problem is solved according to the invention by a tri-state driver arrangement with the characteristics of claim 1 or 11. The sub-claims each define preferred and advantageous embodiments of this invention.

According to one embodiment, the tri-state driver arrangement according to the invention uses a magnetic coupler for the potentially isolated transmission of signals between the input and the output of the tri-state driver arrangement, which can be formed in particular due to a sensor, which works on the principle of the so-called GMR (Giant Magnet Resistor) effect. Likewise, however, other types of magnetic coupler can also be used, such as for example, Hall sensors, signal transformers, etc.

Due to the use of the magnetic coupler, only one channel is required for transmitting information or data and for the activation/deactivation of the output driver of the tri-state driver arrangement. Compared with the state of the art described above, this means a saving on components and driver power. Furthermore, the use of the magnetic coupler allows a saving to be made on the area of silicon required as well as the bonding effort when the tri-state driver arrangement according to the invention is used in a potentially isolated RS-485 interface and this potentially isolated RS-485 interface is integrated into a housing.

Furthermore, a suitable logic or control is proposed within the framework of this invention, which evaluates the output signal from the coupler, in particular the output voltage from the coupler, with respect to a pre-defined limiting range and, depending on this, produces an activation or enable signal for the output driver in order to activate or deactivate this for transmitting data, i.e. to switch it to the high-impedance tri-state condition. In doing so, it is particularly advantageous if the enable signal mentioned is fed to the output driver via a smoothing filter with an appropriate time constant so that the output driver is not unnecessarily switched off for short intervals of time. The procedure suggested within the framework of this invention for evaluating the output signal of the coupler in order to activate the output driver for transmitting data or to switch it to the tri-state condition and thus deactivate it dependent upon this, can be achieved particularly easily and without great expense and, in principle, is independent of the type of coupler used in each case, as long as this has a sufficiently linear output characteristic, which makes it possible to evaluate the output signal of the coupler in accordance with the invention.

This invention is particularly suitable for use in potentially isolated RS-485 interfaces. Of course however, this invention can also be used wherever it is required to transmit potentially isolated signals or data between an input and an output using a tri-state characteristic.

This invention is described in more detail below in the light of preferred embodiments with reference to the attached drawing.

BRIEF DESCRIPTION OF THE DRAWINGS

FIG. 1 shows the principle of construction of a tri-state driver arrangement in accordance with a preferred embodiment of this invention, FIG. 2 shows a current/voltage characteristic of a quasi-linear magnetic coupler used in FIG. 1.

Figure 3:
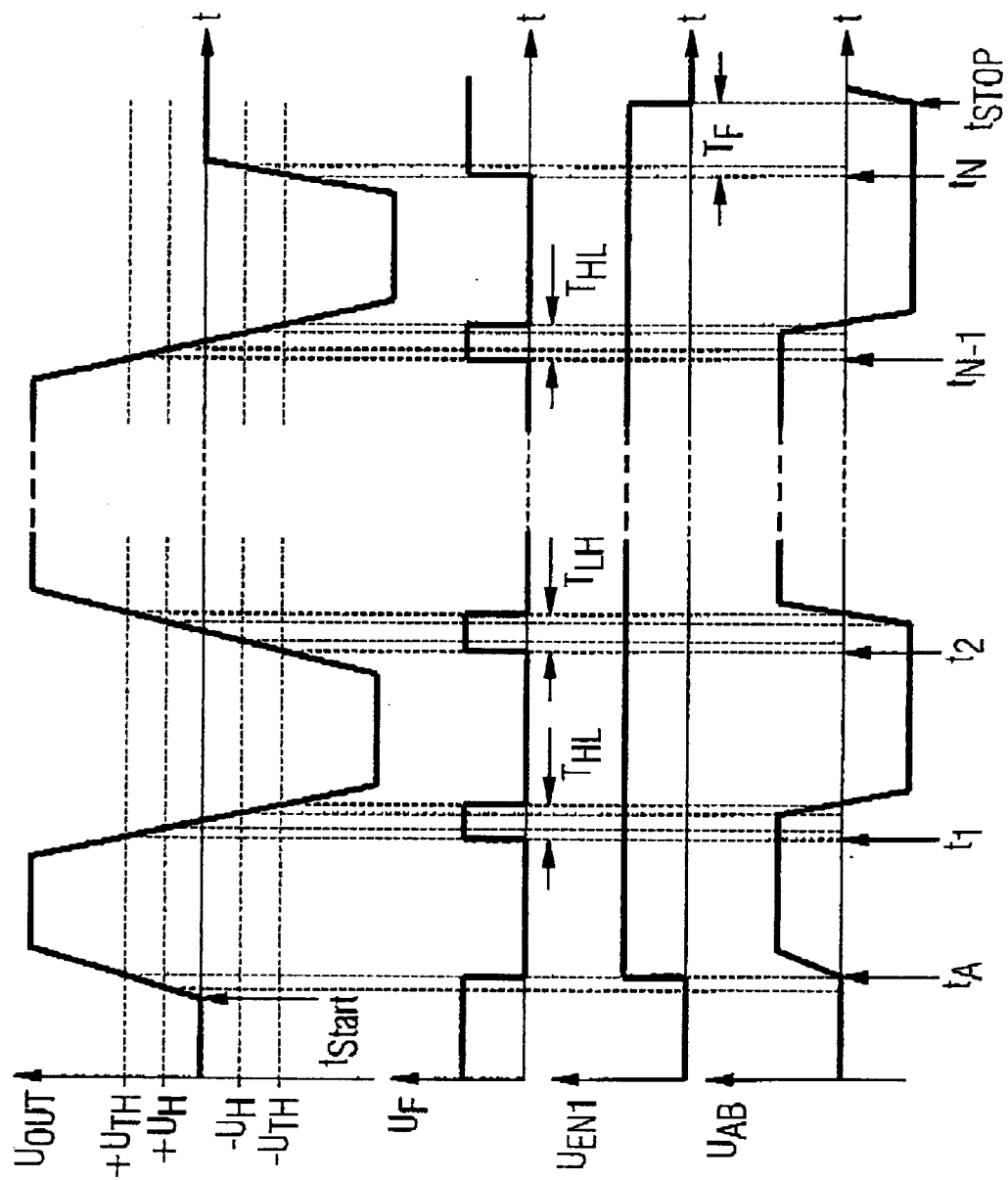
FIG. 3 shows signal responses to clarify the principle of operation of the tri-state driver arrangement shown in FIG. 1, FIG. 4A and FIG. 4B show embodiments for the integration of the tri-state driver arrangement according to the invention into a housing in the form of a two-chip solution and a one-chip solution respectively.

The tri-state driver arrangement 1 shown in FIG. 1 has an input to which an input current $I_{IN}$ is fed. Furthermore, the tri-state driver arrangement has an output, which is to be connected to a two-wire bus cable A, B, for example. The signal transfer between the input and the output of the tri-state driver arrangement is potentially isolated. A magnetic coupler 2 is provided for this purpose, the output voltage of which is amplified by an amplifier 3 and evaluated by a first comparator 4 in order to control a line driver or an output driver 8 accordingly. Furthermore, a second comparator 5 is provided, which also evaluates the output voltage $U_{OUT}$ from the amplifier 3 and, dependent on this, produces an appropriate output signal $U_F$, which is converted with the help of a smoothing filter 6 and a flip-flop 7 into an activating or enable signal $U_{EN1}$ for the output driver 8.

The magnetic coupler 2 can particularly be a sensor, which works on the principle of the so-called GMR ("Giant Magnet Resistor") effect, which detects the change in direction of the magnetic field resulting from the input current $I_{IN}$ and produces an appropriate output voltage $U_{OUT}$ depending on this. At the same time, the magnetic coupler 2 can particularly have a quasi-linear transfer characteristic of the kind shown in FIG. 2. However, the stability and the width of the hysteresis of the characteristic do not play a great part in this invention. It is important however that an output voltage $U_{OUT}$ in the range $-U_{TH} \ldots +U_{TH}$ is produced for an input current $I_{IN}=0$.

The principle of operation of the tri-state driver arrangement shown in FIG. 1 is as follows.

As already mentioned, the output voltage $U_{OUT}$ of the magnetic coupler 2 or the amplifier 3 is evaluated or monitored by the comparator S shown in FIG. 1. This comparator can particularly be a window comparator, which monitors the output voltage $U_{OUT}$ with respect to the lower threshold value $-U_{TH}$ and the upper threshold value $+U_{TH}$, i.e. monitors the input current $I_{IN}$ with respect to the lower threshold value $-I_{TH}$ and the upper threshold value $+I_{TH}$. If the comparator 5 determines that the output voltage $U_{OUT}$ lies in the range $-U_{TH} \ldots +U_{TH}$, i.e. the input current $I_{IN}$ lies in the range $-I_{TH} \ldots +I_{TH}$, the comparator 5 detects the current-free state at the input to the tri-state driver arrangement and, as a result, produces an output voltage $U_F$, which sets the enable signal $U_{EN1}$ on the tri-state input of the output driver 8 to a low level "L" via the reset input R of the flip-flop 7 and thus deactivates the output driver 8, i.e. switches it to the tri-state condition. If the output driver 8 is in the tri-state condition, the tri-state driver arrangement 1 is disconnected from the two-wire bus cable A, B on account of the blocked output of the output driver 8 and is thus no longer able to transmit data. On the other hand, if the comparator 5 detects that the output voltage $U_{OUT}$ of the magnetic coupler 2 is less than $-U_{TH}$ or greater than $+U_{TH}$, i.e. the input current $I_{IN}$ is less than $-I_{TH}$ or greater than $+I_{TH}$, the enable signal $U_{EN1}$ is set to a high level "H" via the set input S of the flip-flop 7 and thus activates the output driver 8, so that data can be transmitted over the two-wire bus cable A, B via the output driver 8.

As has also been previously mentioned, the comparator 4 also monitors the output voltage $U_{OUT}$ of the magnetic coupler 2. This comparator 4 can also be a window comparator, whereby, however, the comparator 4 monitors the output voltage $U_{OUT}$ of the magnetic coupler 2 with respect to the limits $-U_H$ and $+U_H$ shown in FIG. 2, i.e. monitors the input current $I_{IN}$ with respect to $-I_{MIN}$ and the upper threshold value $+I_{MIN}$. If the output voltage $U_{OUT}$ of the magnetic coupler 2 falls below the lower threshold value $-U_H$, i.e. the input current $I_{IN}$ falls below the lower threshold value $-I_{MIN}$, the comparator 4 detects the "low" state $-U_H$ and sets the input voltage $U_{LT}$ on the signal input of the output driver 8 to the low level $U_{LT}$="L", i.e. to the logical value $U_{LT}$="0". On the other hand, if the output voltage $U_{OUT}$ exceeds the threshold value $+U_H$, i.e. the input current $I_{IN}$ exceeds the threshold value $+I_{MIN}$, the comparator 4 detects the "high" state $+U_H$ and sets the input voltage $U_{LT}$ of the output driver 8 to the high level "H", i.e. to the logical value $U_{LT}$="1". As a result, the output driver 8 produces an output voltage $U_{AB}$ corresponding to the input voltage $U_{LT}$ in order to transmit the data or information corresponding to the input current $I_{IN}$ or the output voltage $U_{OUT}$ via the two-wire bus cable A, B.

The comparator 4 is thus arranged in the transmit path of the tri-state driver arrangement while the comparator 5 is arranged in the tri-state path for activating or deactivating the tri-state condition of the output driver 8.

As a rule, the input current $I_{IN}$ passes through the range $-I_{TH} \ldots +I_{TH}$ many times while data is being transmitted. In order that the output driver 8 is not switched off unnecessarily for short intervals of time, a smoothing filter 6 is connected before the reset input R of the flip-flop 7, the magnitude of whose time constant is chosen so that short pulses of output voltage $U_F$ of the comparator 5, which for example have a duration of only 5 to 10 ns, do not lead to a deactivation of the output driver 8. For this purpose, the time constant of the smoothing filter 6 can lie between 50 ns and 100 ns for example.

The principle of operation of the tri-state driver arrangement of FIG. 1 described above is also clear from the signal waveforms shown as an example in FIG. 3. If a subscriber associated with the tri-state driver arrangement 1 starts to send data (at time $t_{START}$), the comparator 5 detects the start of the transmission (at time $t_A$) and activates the output driver 8 with $U_{EN1}$="H". The output driver 8 is now active and starts to transmit. At times $t_1 \ldots t_{N-1}$ short signal pulses $U_F$ occur, which are filtered out due to the time constant of the smoothing filter 6 so that the enable signal $U_{EN1}$ remains constant at the high level "H". As has already been mentioned, the time duration $T_{HL}$ or $T_{LH}$ of these short pulses can lie between 5 ns and 10 ns so that the time constant $T_F$ of the smoothing filter 6 should be set to a value between 50 ns and 100 ns in order to guarantee that these short pulses are reliably filtered out. In the example shown in FIG. 3, it is assumed that the transmission of the data is terminated at time $t_N$ so that after the time constant $T_F$ of the smoothing filter 6 has expired, i.e. at time $t_{STOP}=t_N+t_F$, the output driver 8 is deactivated by setting the enable signal $U_{EN1}$="L".

The tri-state driver arrangement shown in FIG. 1 can be used for example in a potentially isolated RS-485 interface, whereby, on account of the fact that only one channel is required for transmitting information and for the activation/deactivation of the output driver, the area of silicon required as well as the corresponding bonding effort when integrating into a housing can be reduced. At the same time, the tri-state driver arrangement 1 or the RS-485 interface can be provided in the form of a new type of component in a standard housing (for example in an SO-8 or a DIP-8 package).

Figure 4A:
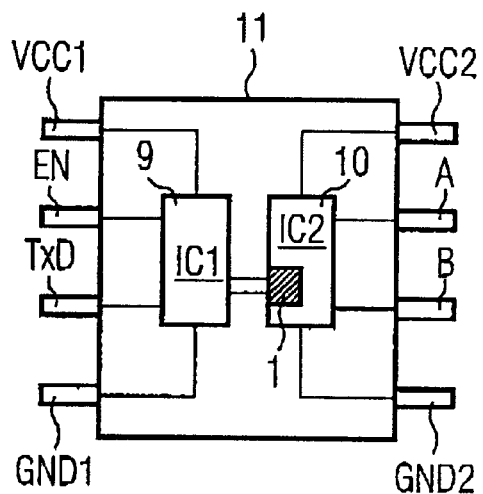

An example of a two-chip solution is shown in FIG. 4A in which two chips 9, 10 (IC1, IC2) are mounted in a common housing and the first chip 9 is used for preparing the signals while the second chip 10 contains the tri-state driver arrangement 1 according to the invention. The arrangement shown in FIG. 4A with two separate chips 9, 10, requires two separate power supply connections VCC1, VCC2 and two separate ground connections GND1, GND2. Furthermore, an input TxD is provided for chip 9 for feeding in the transmission data or for feeding in a transmission signal and an enable input EN. On the other hand, the outputs A, B, which are also shown in FIG. 1, are associated with chip 10.

Figure 4B:
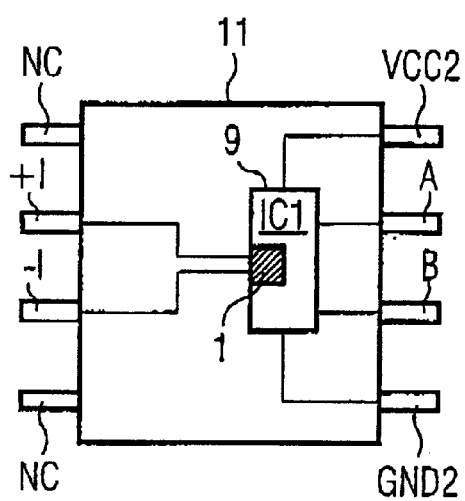
Figure 5:
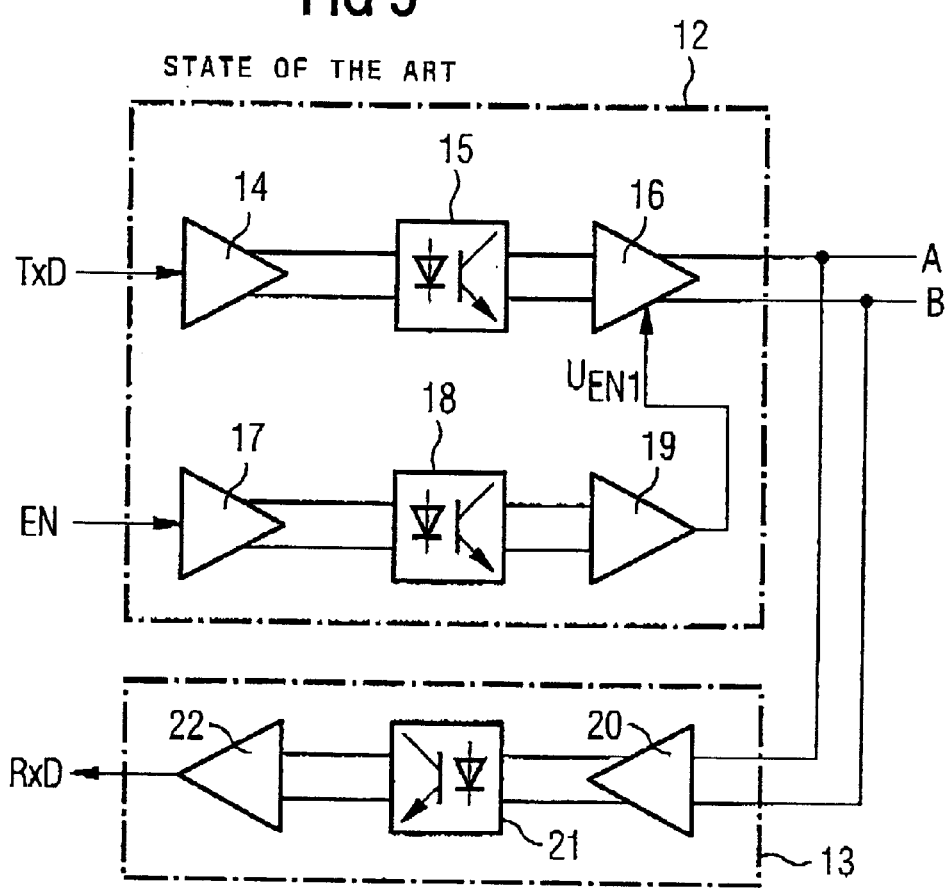
FIG. 5 shows an example of the construction of an RS-485 interface with a tri-state driver arrangement according to the state of the art.

An example of a one-chip solution is shown in FIG. 4B, where in this arrangement only one power supply connection VCC2 and one ground connection GND2 are required. The connections required for feeding in the input current to the tri-state driver arrangement 1 are identified by +I and −I respectively. Furthermore, the signal outputs A, B are again provided. The remaining connection pins are not used and are designated with NC.

What is claimed is:

1. A tri-state driver arrangement comprising:
   a coupler for potentially isolating a transmission of signals between an input and an output of the tri-state driver arrangement;
   an output driver coupled to the output; and
   control means for controlling the output driver in order to switch the output driver to a first or second state for transmitting data and to a third state for deactivating the tri-state driver arrangement, wherein the control means are arranged in such a way that they switch the output driver to the third state when an output signal from the coupler lies within a range defined by a first threshold value and a second threshold value, and wherein the control means are arranged in such a way that they switch the output driver to the first or second state for transmitting data when the output signal from the coupler is larger than a third threshold value or less than a fourth threshold value, the first threshold value being less than the fourth threshold value and the third threshold value being less than the second threshold value.

2. A tri-state driver arrangement according to claim 1, wherein the coupler is a magnetic coupler.

3. A tri-state driver arrangement according to claim 2, wherein the magnetic coupler is formed by a sensor, which works on the principle of the GMR (Giant Magnet Resistor) effect.

4. A tri-state driver arrangement according to claim 1, wherein the control means are arranged in such a way that the control means evaluate an output voltage from the coupler, in order to switch the output driver to the third state depending on the output voltage.

5. A tri-state driver arrangement according to claim 1, wherein the coupler is arranged in such a way that the coupler converts an input current fed to an input of the tri-state driver arrangement into a corresponding output voltage.

6. A tri-state driver arrangement according to claim 1, wherein the control means includes a comparator, which produces a control signal dependent upon an output voltage of the coupler for controlling the output driver, whereby the control signal assumes a first value, which activates the output driver if the output voltage of the coupler lies outside the range defined by the first and second threshold values, whereas the control signal assumes a second value, which deactivates the output driver and switches it to the third state if the output voltage of the coupler lies within the range defined by the first and second threshold values.

7. A tri-state driver arrangement according to claim 6, wherein the control signal produced by the comparator is fed to the output driver via a smoothing filter.

8. A tri-state driver arrangement according to claim 1, wherein the coupler has a linear input current/output voltage characteristic.

9. A tri-state driver arrangement according to claim 1, wherein the control means includes a comparator, which sets an input voltage of the output driver to a first or second value for transmitting data depending upon an output voltage of the coupler.

10. A tri-state driver arrangement according to claim 9, wherein the comparator sets the input voltage of the output driver to the first or second value if the output voltage of the coupler is larger than the third threshold value or less than the fourth threshold value.

11. A tri-state interface connecting a subscriber to a bus cable comprising:
    a tri-state driver arrangement according to claim 1, wherein an input side of the tri-state driver arrangement is to be connected to the subscriber via the coupler of the tri-state driver arrangement, and wherein an output side of the tri-state driver arrangement is to be connected to the bus cable via the output driver of the tri-state driver arrangement.

12. A tri-state interface according to claim 11, wherein the tri-state interface is arranged as an RS-485 interface.

* * * * *